United States Patent
Agata et al.

(10) Patent No.: US 6,788,565 B2
(45) Date of Patent: Sep. 7, 2004

(54) SEMICONDUCTOR MEMORY DEVICE

(75) Inventors: Masashi Agata, Osaka (JP); Kazunari Takahashi, Shiga (JP); Masanori Shirahama, Shiga (JP); Naoki Kuroda, Kyoto (JP); Hiroyuki Sadakata, Osaka (JP); Ryuji Nishihara, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 17 days.

(21) Appl. No.: 10/394,262

(22) Filed: Mar. 24, 2003

(65) Prior Publication Data

US 2003/0179629 A1 Sep. 25, 2003

(30) Foreign Application Priority Data

Mar. 25, 2002 (JP) .......................................... 2002-083353

(51) Int. Cl.$^7$ .................................................. G11C 11/40
(52) U.S. Cl. ........................................ 365/149; 365/187
(58) Field of Search ................................. 365/149, 150, 365/187

(56) References Cited

U.S. PATENT DOCUMENTS

| 5,600,598 | A | | 2/1997 | Skjaveland et al. ..... 365/189.11 |
| 5,796,650 | A | | 8/1998 | Wik et al. ................... 365/150 |
| 6,016,268 | A | * | 1/2000 | Worley ........................ 365/149 |
| 6,137,713 | A | | 10/2000 | Kuroda et al. .............. 365/149 |
| 6,137,716 | A | * | 10/2000 | Wik ....................... 365/185.01 |
| 6,339,240 | B1 | * | 1/2002 | Kim ........................... 257/296 |
| 6,744,658 | B2 | * | 6/2004 | Noda ........................ 365/149 |

* cited by examiner

Primary Examiner—Tan T. Nguyen
(74) Attorney, Agent, or Firm—McDermott Will & Emery LLP

(57) ABSTRACT

A semiconductor memory device has a plurality of memory cells each having a first transistor, a second transistor having a source or drain connected to one portion of the source or drain of the first transistor, and a third transistor having a source or drain connected to the other portion of the source or drain of the first transistor. The first transistor accumulates, in the channel thereof, charges transferred from the second and third transistors.

17 Claims, 11 Drawing Sheets

SEMICONDUCTOR MEMORY DEVICE

BACKGROUND OF THE INVENTION

The present invention relates to a semiconductor memory device having DRAM cells using MIS transistors as means for accumulating charges and capable of high-speed data transfer.

As a large-capacity semiconductor memory device capable of holding a large amount of data, there has conventionally been used a semiconductor memory device having DRAM cells composed of capacitors for accumulating charges and switch transistors for transferring the charges to the capacitors. However, the structures of DRAM cells such as stacked DRAM cells have been increasingly complicated as semiconductor memory devices have been scaled down and increased in performance. In particular, increased manufacturing cost presents a problem when the semiconductor memory devices are used in system LSIs.

For a cost reduction, a semiconductor memory device using MIS transistors as means for accumulating charges has been developed in recent years.

Referring to the drawings, a semiconductor memory device disclosed in U.S. Pat. No. 5,600,598 will be described as a conventional example. The semiconductor memory device uses DRAM cells which accumulate charges in MIS transistors.

FIG. 11 shows a circuit structure of each of the DRAM cells of the semiconductor memory device according to the conventional example. A DRAM cell 200 shown in FIG. 11 has a structure such that a channel is formed by applying a bias voltage Vcp to the gate of a first transistor 201 as an n-channel MIS transistor and charges are accumulated in a capacitance produced in the channel. In such a structure, if a second transistor 202 is turned ON by inputting a signal indicative of data to a bit line BL and driving a word line WL, charges are transferred between the bit line BL and the channel of the first transistor 201 so that the writing of the data is performed. If the second transistor 202 is turned ON, after precharging the bit line BL to a specified voltage, by driving the word line WL, a potential in the bit line BL changes depending on the presence or absence of charges in the channel of the first transistor 201. By sensing and amplifying the potential change, the data is outputted to the bit line BL.

Since the first and second transistors 201 and 202 of the semiconductor memory device according to the conventional example are implemented as a planar structure, intricate fabrication techniques are unnecessary so that a reduction in fabrication cost is achievable.

However, the conventional semiconductor memory devices requires a given period of time until the specified potential is reached by the precharging operation after the word line WL is activated, the potential change in the bit line is sensed and amplified, and the data is read onto the bit line BL. If the DRAM cell 200 is accessed immediately after the activation period for the word line WL is completed, the potential on the bit line BL may affect the charges in the channel of the first transistor 201 and destroy the data. Thus, the conventional semiconductor memory device has the problem that the DRAM 200 cannot be accessed for a given period of time after a preceding access to the DRAM cell 200 and therefore it is difficult to increase a data transfer speed in write/read operations.

SUMMARY OF THE INVENTION

It is therefore an object of the present invention to solve the foregoing conventional problem and thereby increase a data transfer speed in a semiconductor memory device using a MIS transistor as charge accumulating means.

To attain the object, a first semiconductor memory device according to the present invention comprises: a plurality of memory cells each having a first transistor, a second transistor having a source or drain connected to a portion of a source or drain of the first transistor, and a third transistor having a source or drain connected to another portion of the source or drain of the first transistor, the first transistor accumulating, in a channel thereof, a charge transferred from the second and third transistors.

In the first semiconductor memory device, the transfer of the charge from the second and third transistors to the first transistor can be controlled independently by using the two transistors. Accordingly, the first transistor can be accessed, after data transfer performed by using one of the second and third transistors, by the other transistor so that a data transfer speed is increased.

In the first semiconductor memory device, the first, second, and third transistors are preferably of the same conductivity type.

The arrangement obviates the necessity to provide an isolation between the memory cells so that a semiconductor memory device with a high data transfer speed is implemented at low cost.

In the first semiconductor memory device, the first, second, and third transistors are preferably p-channel transistors.

The arrangement achieves a reduction in leakage current in each of the first, second, and third transistors so that a semiconductor memory device with low power consumption and a high data transfer speed is implemented at low cost.

In the first semiconductor memory device, the first, second, and third transistors are preferably n-channel transistors.

The arrangement improves the mobility of the carrier in the channel of each of the first, second, and third transistors so that a semiconductor memory device capable of high-speed operation is implemented.

In the first semiconductor memory device, a predetermined voltage is preferably applied to a gate of the first transistor such that the first transistor is in a conductive state when a power supply is ON.

In the first semiconductor memory device, the first transistor is preferably of depletion type.

The arrangement reduces power consumption during the accumulation of the charge in the capacitance between the gate and channel.

Preferably, the first semiconductor memory device further comprises: a plurality of first word lines connected to respective gates of the second transistors of the plurality of memory cells; and a plurality of second word lines connected to respective gates of the third transistors of the plurality of memory cells, wherein activation of one of the plurality of first word lines and activation of one of the plurality of second word lines are initiated alternately.

In the first semiconductor memory device, one of the plurality of first word lines and one of the plurality of second word lines which are connected to different memory cells preferably have respective activation periods in overlapping relation and one of the plurality of first word lines and one of the plurality of second word lines which are connected to a same memory cell preferably have respective activation periods in non-overlapping relation.

In the first semiconductor memory device, one of the first and second word lines connected to the same memory cell which is activated earlier than the other is preferably brought into an inactivated state such that the activation period thereof does not overlap the activation period of the other word line.

Preferably, the first semiconductor memory device further comprises: a plurality of first bit lines connected to the respective sources or drains, which are not connected to the first transistors, of the second transistors; and a plurality of second bit lines connected to the respective sources or drains, which are not connected to the first transistors, of the third transistors, wherein the memory cells are arranged with an isolation region interposed therebetween in a direction in which the first and second word lines extend and are arranged in an indiscrete active region with the second and third transistors alternately interposed therebetween in a direction in which the first and second bit lines extend, each of contacts providing connections between the second transistors and the first bit lines is used commonly by the respective second transistors of the adjacent memory cells which are opposed to each other, and each of contacts providing connections between the third transistors and the second bit lines is used commonly by the respective third transistors of the adjacent memory cells which are opposed to each other.

The arrangement obviates the necessity to provide an isolation between the memory cells adjacent to each other in the direction of the bit lines and thereby provides a high-density memory cell array.

In the first semiconductor memory device, each of the second transistors is preferably formed to have a channel crossing widthwise under the corresponding one of the first bit lines and each of the third transistors is preferably formed to have a channel crossing widthwise under the corresponding one of the second bit lines.

The arrangement reduces the area of the channel region in each of the second and third transistors and suppresses a leakage current.

In the first semiconductor memory device, respective gate electrodes of the first transistors are preferably disposed between the first and second word lines in parallel relation with the first and second word lines.

In the first semiconductor memory device, each of the first, second, and third transistors is preferably formed to have a channel passing widthwise over the corresponding ones of the first and second bit lines.

A second semiconductor memory device according to the present invention comprises: a plurality of memory cells each having a first transistor, a second transistor having a source or drain connected to a gate of the first transistor, and a third transistor having a source or drain connected to the gate of the first transistor, each of the second and third transistors transferring a charge to the gate of the first transistor.

In the second semiconductor memory device, the transfer of the charge from the second and third transistors to the first transistor can be controlled independently by using the two transistors. Accordingly, the first transistor can be accessed, after data transfer performed by using one of the second and third transistors, by the other transistor so that a data transfer speed is increased.

In the second semiconductor memory device, the first, second, and third transistors are preferably of the same conductivity type.

In the second semiconductor memory device, the first, second, and third transistors are preferably p-channel transistors.

In the second semiconductor memory device, the first, second, and third transistors are preferably n-channel transistors.

DETAILED DESCRIPTION OF THE INVENTION

Embodiment 1

A first embodiment of the present invention will be described with reference to the drawings.

A semiconductor memory device according to the first embodiment comprises a memory cell array composed of DRAM cells and a peripheral circuit for inputting/outputting data to and from the memory cell array. A description will be given first to the DRAM cells composing the semiconductor memory device according to the first embodiment.

Figure 1:
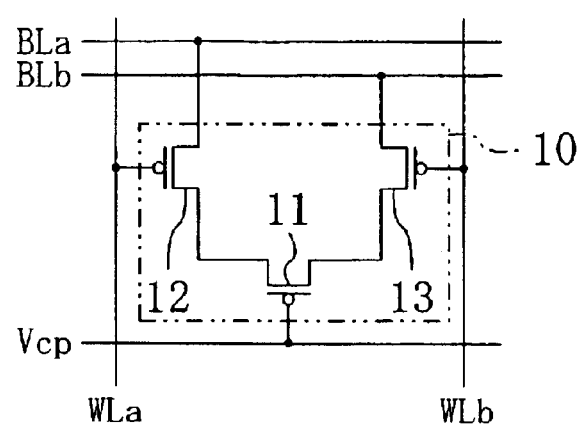
FIG. 1 is a circuit diagram showing a DRAM cell in a semiconductor memory device according to a first embodiment of the present invention.

FIG. 1 shows a circuit structure of each of the DRAM cells in the semiconductor memory device according to the first embodiment. As shown in FIG. 1, a DRAM cell 10 according to the first embodiment is composed of: a first transistor 11 composed of a p-channel MIS transistor for accumulating charges; a second transistor 12 composed of a p-channel MIS transistor having a source connected to the source or drain of the first transistor 11; and a third transistor 13 composed of a p-channel MIS transistor having a source connected to the source or drain of the first transistor 11. The second transistor 12 has a gate connected to a first word line WLa and a drain connected to a first bit line BLa. The third transistor 13 has a gate connected to a second word line WLb and a drain connected to a second bit line BLb.

Since the first transistor 11 is constituted to move charges in both ways in the DRAM cell 10, the first transistor 11 is not limited to the structure in which the two terminals other than the gate are the source and drain, respectively. Each of the two terminals other than the gate of the first transistor 11 may be a source or a drain.

A negative voltage is applied as a bias voltage Vcp to the gate of the first transistor 11 such that it is in a conductive state when a power supply for the semiconductor memory device is in the ON state. This allows the accumulation of charges in the capacitance between the channel and gate of the first transistor 11 and retention of data as the presence or absence of the charges.

The second and third transistors 12 and 13 allow access to the first transistor 11 from the first and second bit lines BLa and BLb connected to the respective drains of the second and third transistors 12 and 13 by bringing the first and second word lines WLa and WLb connected to the respective gates of the second and third transistors 12 and 13 into low potential states and thereby activating the first and second word lines WLa and WLb.

A description will be given next to a structure of the memory cell array consisting of the DRAM cells 10 each having the foregoing circuit structure, which are arranged as a matrix.

Figure 2:
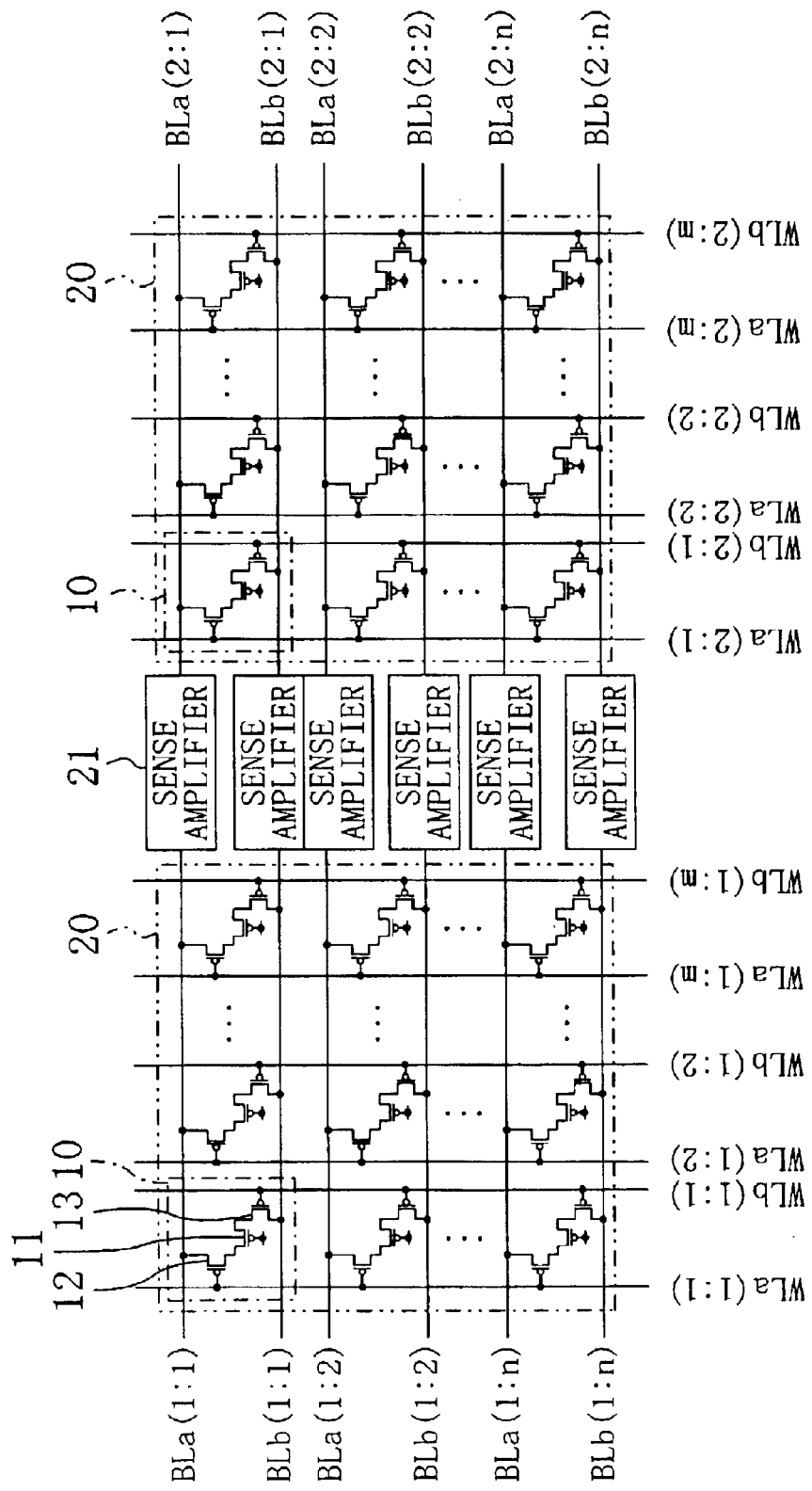
FIG. 2 is a circuit diagram showing a memory cell array in the semiconductor memory device according to the first embodiment.

FIG. 2 shows the circuit structure of the memory cell array in the semiconductor memory device according to the first embodiment.

As shown in FIG. 2, two memory cell arrays 20 are arranged in a column direction in the semiconductor memory device according to the first embodiment. The bit lines BLa and BLb extending from each of the memory cell arrays 20 are connected to sense amplifiers 21 provided between the memory cell arrays 20.

In each of the memory cell arrays 20, the DRAM cells 10 each composed of the first, second, and third transistors 11, 12, and 13 are arranged as a m×n matrix (where m and n are positive integers). In the memory cell array 20, the m second transistors 12 arranged in a row direction are connected by one of the first word lines WLa, while the n second transistors 12 arranged in a column direction are connected by one of the first bit lines BLa. Likewise, the m third transistors 13 are connected by one of the second word lines WLb, while the n third transistors 13 are connected by one of the second bit lines BLb. The respective gates of the m first transistors 11 arranged in a row direction are connected to each other, though the depiction thereof is omitted.

In FIG. 2, each of the first and second word lines WLa and WLb and the first and second bit lines BLa and BLb has a suffix (k:1) indicative of the row address of the word line and the column address of the bit line. In the suffix, k specifies either one of the two memory cell arrays 20 and 1 specifies any one of the n word lines or m bit lines in the memory cell array 20 specified by k.

The semiconductor memory device according to the first embodiment is characterized in that each of the DRAM cells 10 is composed of the first transistor 11 for accumulating charges and the second and third transistors 12 and 13 for transferring the charges to the first transistor and the writing and reading of data in and from the DRAM cell 10 is performed by access to the DRAM 10 using two ports which are a path (hereinafter referred to as the port a) using the first word line WLa and the first bit line BLa each connected to the second transistor 12 and a path (hereinafter referred to as the port b) using the second word line WLb and the second bit line BLb each connected to the third transistor 13.

The first word lines WLa (1:1) to WLa (2:n) are connected to a first row decoder and the second word lines WLb (1:1) to WLb (2:n) are connected to a second row decoder, though they are not depicted. The first and second bit lines BLa and BLb are connected to respective data buses via switches or amplifiers to perform data input/output operations with the outside.

Referring to the drawings, a description will be given next to a specific structure of each of the memory cell arrays 20 having the foregoing circuit structure.

Figure 3A:
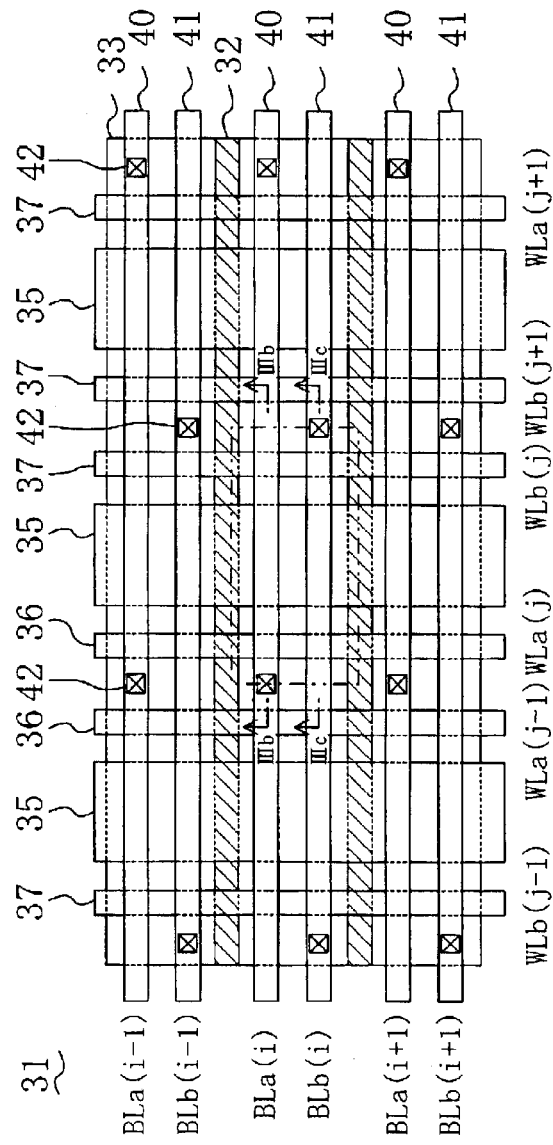
FIG. 3A is a plan view showing the memory cell array in the semiconductor memory device according to the first embodiment and FIGS. 3B and 3C are structural cross-sectional views taken along the respective lines IIIb—IIIb and IIIc—IIIc of FIG. 3A.
Figure 3B:
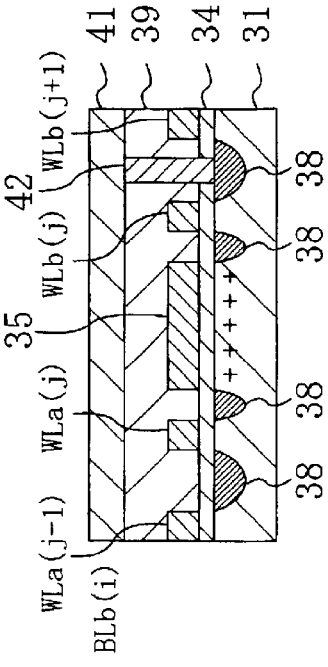
Figure 3C:
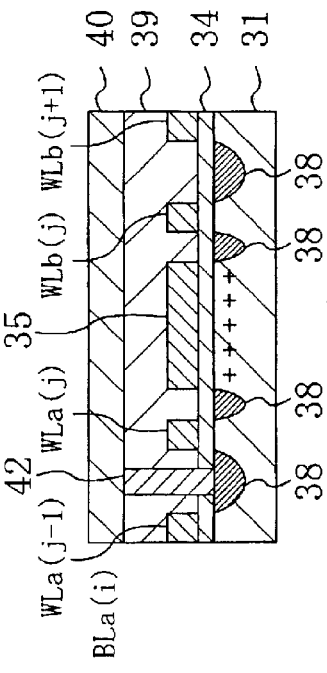

FIG. 3A shows a plan structure of the memory cell array 20 in the semiconductor memory device according to the first embodiment. FIGS. 3B and 3C show cross-sectional structures taken along the respective lines IIIb—IIIb and IIIc—IIIc of FIG. 3A. It is to be noted that FIG. 3A shows only the 3×3 DRAM cells in the memory cell array 20, in which the region enclosed by the two dot lines corresponds to one DRAM cell.

As shown in FIGS. 3A to 3C, in an n-type well 31 formed in a semiconductor substrate composed of, e.g., silicon, a plurality of isolation insulating films 32 each composed of a silicon oxide extend in substantially the same direction in spaced apart relation so that active regions 33 are defined in stripes between the isolation insulating films 32. On the n-type well 31, a plurality of first gate electrodes 35 each composed of polysilicon and extending in a direction crossing the active regions 33 are formed in parallel and spaced apart relation via gate insulating films 34 composed of a silicon oxide.

On one side of each of the first gate electrodes 35, second gate electrodes 36 composed of polysilicon are formed in parallel and spaced apart relation to the first gate electrode 35. On the other side of the first gate electrode 35, third gate electrodes 37 composed of polysilicon are formed in parallel and spaced apart relation to the first gate electrode 35.

The second and third gate electrodes 36 and 37 on both sides of one of the first gate electrodes 35 and the second and third gate electrodes 36 and 37 on both sides of the two gate electrodes 35 adjacent thereto are formed by switching the respective positions thereof relative to the first gate electrodes 35 interposed therebetween. That is, the two second gate electrodes 36 are formed between one of the first gate electrodes 35 and one of the two first gate electrodes 35 adjacent thereto, while the two third gate electrodes 37 are formed between one of the first gate electrodes 35 and the other of the two first gate electrodes 35 adjacent thereto.

Impurity diffusion regions 38 each containing a p-type impurity diffused therein are formed in the portions of the active regions 33 located between the individual gate electrodes (the first, second, and third gate electrodes 35, 36, and 37). First and second metal lines 40 and 41 made of aluminum (Al), copper (Cu), or the like and extending along the active regions 33 are formed in parallel and spaced apart relation over each of the active regions 33 extending in parallel to each other via interlayer insulating films 39 made of a silicon oxide and formed over the respective gate electrodes.

Those of the impurity diffusion regions 38 formed between the adjacent second gate electrodes 36 are connected to the first metal lines 40 by contacts 42 made of tungsten or the like. Those of the impurity diffusion regions 38 formed between the adjacent third gate electrodes 37 are connected to the second metal lines 41 by the contacts 42. This allows compact layout in which the contacts 42 are used commonly by the adjacent DRAM cells.

Here, the first gate electrodes 35 and the impurity diffusion regions on both sides thereof constitute the first transistors 11. Likewise, the second gate electrodes 36 and the impurity diffusion regions 38 on both sides thereof constitute the second transistors 12 and the third gate electrodes 37 and the impurity diffusion regions 38 on both sides thereof constitute the third transistors 13. The channel width of each of the transistors (the first, second, and third transistors 11, 12, and 13) corresponds to the width of each of the active regions 33 including the portions underlying the first and second metal lines 40 and 41.

The second gate electrodes 36 and the third gate electrodes 37 serve as the first word lines WLa and the second word lines WLb, respectively. The area of each of the active regions 33 containing the first gate electrode 35 and the second and third gate electrodes 36 and 37 formed on both sides of the first gate electrode 35 constitutes one DRAM cell.

In a structure as described above, the DRAM cells 10 are arranged repetitively in the same orientation in the direction in which the word lines extend in the memory cell arrays 20. In the direction in which the bit lines extend, the DRAM cells 10 are arranged repetitively by alternating the orientations thereof by 180°. In other words, the DRAM cells adjacent to each other in the direction in which the bit lines extend are arranged to have the respective second transistors 12 opposed to each other and have the respective third transistors 13 opposed to each other.

Specifically, the DRAM cells at the row address j (i.e., the DRAM cells connected to the first word line WLa(j) and to the second word line WLb(j)) have the respective second transistors 12 opposed to the respective second transistors 12 of the DRAM cells at the row address (j−1) and have the respective third transistors 13 opposed to the respective third transistors 13 of the DRAM cells at the row address (j+1).

Each of the impurity diffusion regions 38 connected to the contacts 42 is shared as the source or drain of the second or third transistor 12 or 13 by the memory cells adjacent to each other.

If the memory cell array 20 is thus constituted, it is no more necessary to provide isolations between the DRAM cells 10 adjacent to each other in the direction of the bit lines in each of the active regions 33 so that a high-density memory cell array is obtained.

Referring to the drawings, a description will be given herein below to the operation of the semiconductor memory device according to the first embodiment thus constituted.

Figure 4:
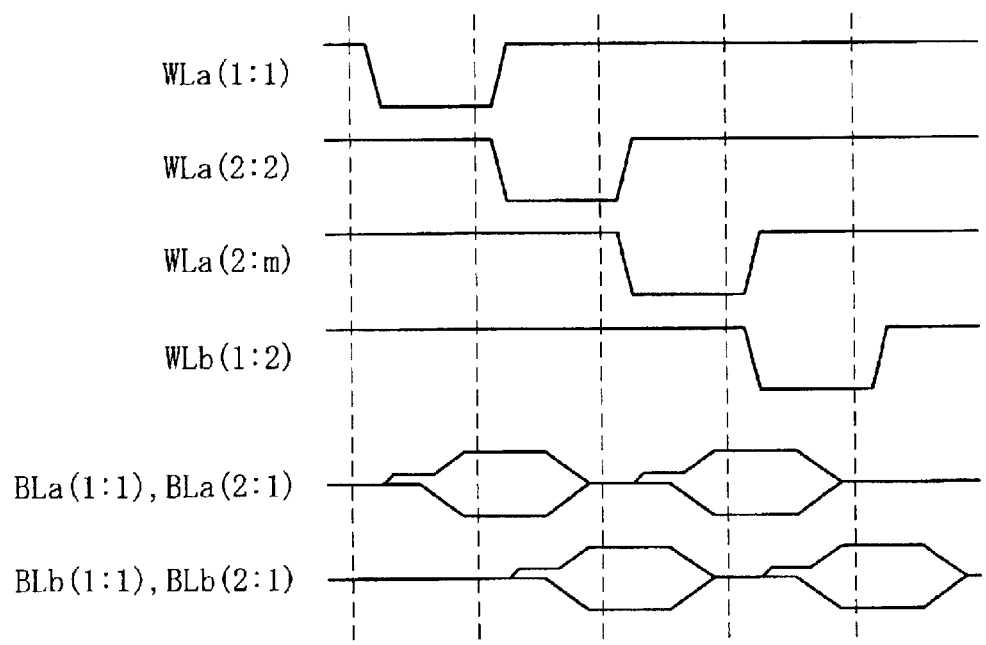
FIG. 4 is a timing chart illustrating a read operation to the memory cell array in the semiconductor memory device according to the first embodiment.

FIG. 4 shows an operational timing related to a read operation performed to each of the memory cell arrays 20 shown in FIG. 2. By way of example, the operational timing when data is read from the four DRAM cells 10 at the respective row addresses (1:1), (2:2), (2:m), and (1:2) is shown.

In the operation shown in FIG. 4, an instruction to perform a read operation is first inputted to a control signal from outside the semiconductor memory device. Then, a signal repeatedly specifying the ports a and b in this order is inputted to a port select signal and (1:1), (2:2), (2:m), and (1:2) are inputted successively to a row address signal.

When the port select signal specifies the port a, an activation signal in synchronism with a synchronous clock is inputted to the first row decoder so that the first word line WLa (1:1) is selected based on the row address signal. This brings the first word line WLa (1:1) into an activated state only for a specified period. Since the DRAM cell 10 has a p-channel structure, each of the word lines has been designed such that a low-potential state coincides with the activated state.

Each of the first and second row decoders selects one of the first and second word lines WLa and WLb based on the row address signal and activates the selected word line based on the synchronous clock.

When the first word line WLa (1:1) is brought into the activated state, the second transistor 12 of each of the n DRAM cells connected to the first word line WLa (1:1) is turned ON so that the movement of charges between the second and first transistors 12 and 11 changes potentials on the first bit lines BLa (1:1) to BLa (1:n). The potential change in each of the first bit lines BLa is amplified by the corresponding sense amplifier 21 so that data is outputted through the corresponding data bus. Thereafter, the first word line WLa is inactivated and each of the first bit lines BLa is precharged until a specified potential is reached.

When the read operation to one of the DRAM cells 10 is thus completed, the port select signal selects the port b and the second word line is activated upon the inactivation of the first word line so that the second row decoder drives the second word line WLb (2:2) into an activated state. This turns ON each of the third transistors 13 connected to the second word line WLb (2:2) and the charges accumulated in the respective first transistors are outputted to the second bit lines BLb (2:1) to BLb (2:n) connected to the respective third transistors 13 and amplified by the sense amplifiers 21 so that data is outputted through the data bus.

In the same manner as shown above, information in the DRAM cells 10 at the row addresses (2:m) and (1:2) can be read out successively thereof. Since read/write operations via the port a using the second transistor 13 and the port b using the third transistor 13 can thus be performed, it is possible to activate the word line via one of the ports while, e.g., a precharge operation is performed via the other port. In other words, the data transfer speed in a conventional semiconductor memory device can substantially be doubled.

If the activation period of each of the word lines WLa and WLb is extended by using, e.g., a delay circuit or the like in the semiconductor memory device according to the first embodiment, it is possible to accumulate sufficient charges in the first transistors 11 and thereby improve the reliability of data held in the DRAM cells 10. When the activation period of each of the first and second word lines WLa and WLb is extended, however, the respective activation periods thereof are brought into overlapping relation. If the cells at the same row address are accessed in succession, it follows therefore that the second and third transistors 12 and 13 of the respective cells are simultaneously turned ON so that data stored in the first transistors 11 is destroyed. To prevent this, the first embodiment provides a word line driver for exclusively activating the first or second word line WLa or WLb between the first and second word lines WLa and WLb and the first and second row decoders.

Figure 5A:
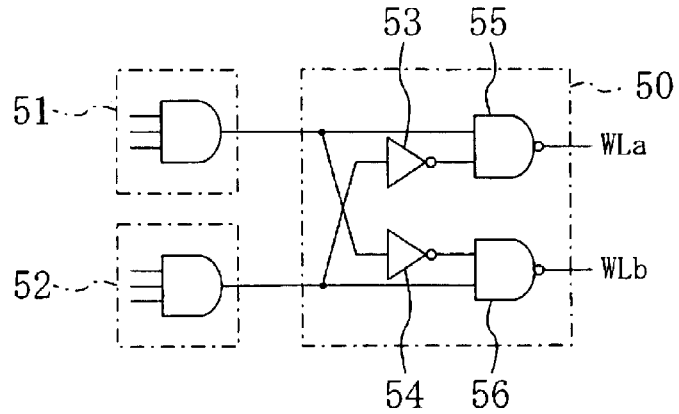
FIG. 5A is a circuit diagram showing a word line driver in the semiconductor memory device according to the first embodiment and FIGS. 5A and 5B are timing charts each illustrating the operation of the word line driver shown in FIG. 5A.

FIG. 5A shows a circuit structure of the word line driver in the semiconductor memory device according to the first embodiment.

As shown in FIG. 5A, the word line driver 50 is provided between the first and second row decoders 51 and 52 for selecting the first and second word lines WLa and WLb, respectively, and the first and second word lines WLa and WLb and is constituted by: a first inverter 53 for inverting an output signal from the second row decoder 52 and outputting the inverted signal; a second inverter 54 for inverting an output signal from the first row decoder 51 and outputting the inverted signal; a first NAND circuit 55 receiving the respective output signals from the first row decoder 51 and the first inverter 53; and a second NAND circuit 56 receiving the respective output signals from the second row decoder 52 and the second inverter 54.

It is to be noted the word line driver 50 is provided for each pair of the first word lines WLa (1:1) to WLa (2:n) and the second word lines WLb (1:1) to WLb (2:n).

Figure 5B:
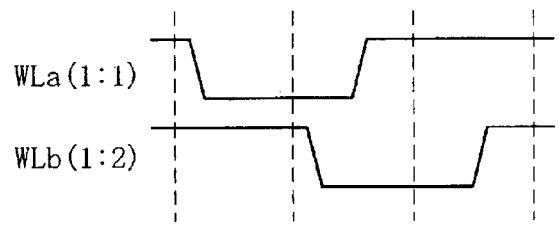
Figure 5C:
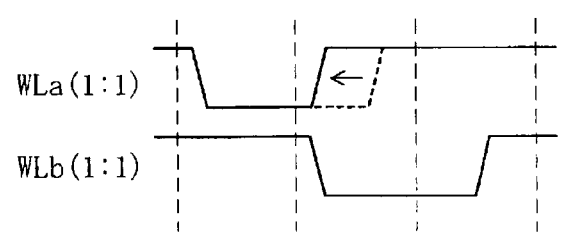

FIGS. 5B and 5C are timing charts each illustrating the difference between the operations of the word line drivers 50 according to the first embodiment when the DRAM cells 10 at different row addresses are accessed in succession and when the DRAM cells 10 at the same row address are accessed in succession.

FIG. 5B shows the operational waveforms of the word lines when the DRAM cells 10 at the respective row addresses (1:1) and (1:2) are accessed in succession.

First, the port a is selected by the port select signal and the first row decoder 51 is driven so that a high potential signal is inputted to one of the terminals of the word line driver 50 connected to the first word line WLa (1:1) based on the address signal. On the other hand, the second row decoder 52 is not driven so that the other terminal of the word line driver 50 connected to the second word line WLb (1:1) is in a low potential state. As a result, a high potential signal is inputted from the first row decoder 51 to one of the terminals of the first NAND circuit 55 and a high potential signal is inputted from the second row decoder 52 to the other terminal thereof via the second inverter 54 so that the first NAND circuit 55 outputs a low potential signal. This activates the first word line WLa (1:1).

Subsequently, the port b is selected by the port select signal and the second row decoder 52 is driven so that a high potential signal is inputted to one of the terminals of the word line driver 50 connected to the second word line WLb (1:2). On the other hand, the first row decoder 51 is not driven so that the other terminal of the word line driver 50 connected to the first word line WLa (1:2) is in a low potential state. As a result, a high potential signal is inputted from the first row decoder 51 to one of the terminals of the second NAND circuit 56 and a high potential signal is inputted from the second row decoder 51 to the other terminal thereof via the first inverter 53 so that the second NAND circuit 56 outputs a low potential signal. This activates the second word line WLb (1:2).

Since the activation period of each of the first and second word lines WLa (1:1) and WLb (1:2) is extended by a delay circuit or the like, the first word line WLa (1:1) is not inactivated at the time at which the second word line is activated by driving the second row decoder 52 after the inactivation of the first row decoder 51, so that the respective activation periods of the first and second word lines WLa and WLb are in overlapping relation. Because of their different row addresses, the respective operations of the first and second word lines WLa and WLb are not affected by the extended activation periods thereof.

If the two DRAM cells 10 at the row address (1:1) are accessed in succession as shown in FIG. 5C, the first NAND circuit 55 first outputs a low potential signal in the same manner as shown in FIG. 5B so that the first word line WLa (1:1) is activated. Then, the first row decoder 51 is inactivated and the second row decoder 52 is driven so that a high potential signal is inputted to the word line driver 50. As a result, a low potential signal is inputted from the first row decoder 51 to one of the terminals of the first NAND circuit 55 and a low potential signal is inputted from the second row decoder 52 to the other terminal thereof via the first inverter 53 so that the first NAND circuit 55 outputs a high potential signal to inactivate the first word line WLa (1:1). At the same time, a high potential signal is inputted from the second row decoder 52 to one of the terminals of the second NAND circuit 56 and a high potential signal is inputted from the first row decoder 51 to the other terminal thereof via the second inverter 54 so that the second NAND circuit 56 outputs a low potential signal to activate the second word line WLb (1:1).

Thus, the use of the word line driver 50 allows, if the first and second word lines WLa and WLb at the same row address are activated in succession, one of the first and second word lines WLa and WLb activated earlier than the other to be inactivated such that the activation period thereof is in non-overlapping relation with that of the other word line. Even if the activation period of each of the first and second word lines WLa and WLb is extended, therefore, data held by the first transistor 11 is not destroyed.

As described above, the semiconductor memory device according to the first embodiment achieves a transfer speed which is approximately double the transfer speed achieved by the conventional semiconductor memory device since the first transistor 11 composed of a MIS transistor as means for holding data can be accessed via the port a using the second transistor 12 and the port b using the third transistor 13.

Since each of the DRAM cells 10 accumulates charges in the first transistor 11 thereof in the semiconductor memory device according to the first embodiment, a complicated structure such as a stacked capacitor need not be used. This allows the DRAM cell 10 to be formed as a planar MIS transistor so that a low-cost and high-performance semiconductor memory device is implemented.

Since each of the transistors composing the DRAM cell 10 is formed as a p-channel MIS transistor in the semiconductor memory device according to the first embodiment, a leakage current is reduced therein.

In the structure of the DRAM cell 10 according to the first embodiment, each of the second and third transistors 12 and 13 need not necessarily be a p-channel transistor. Either one or each of the second and third transistors 12 and 13 may be an n-channel transistor. In this case, the specific structure of the memory cell array and a voltage applied to the word lines WLa and WLb should naturally be changed but the same effect concerning a higher data transfer speed as described above is achievable.

Variations of Embodiment 1

Referring to the drawings, descriptions will be given herein below to variations of the semiconductor memory device according to the first embodiment, of which one is obtained by changing the layout of the memory cell array 20 and the other is obtained by changing the structure of the DRAM cell.

Variation of Memory Cell Array

Figure 6A:
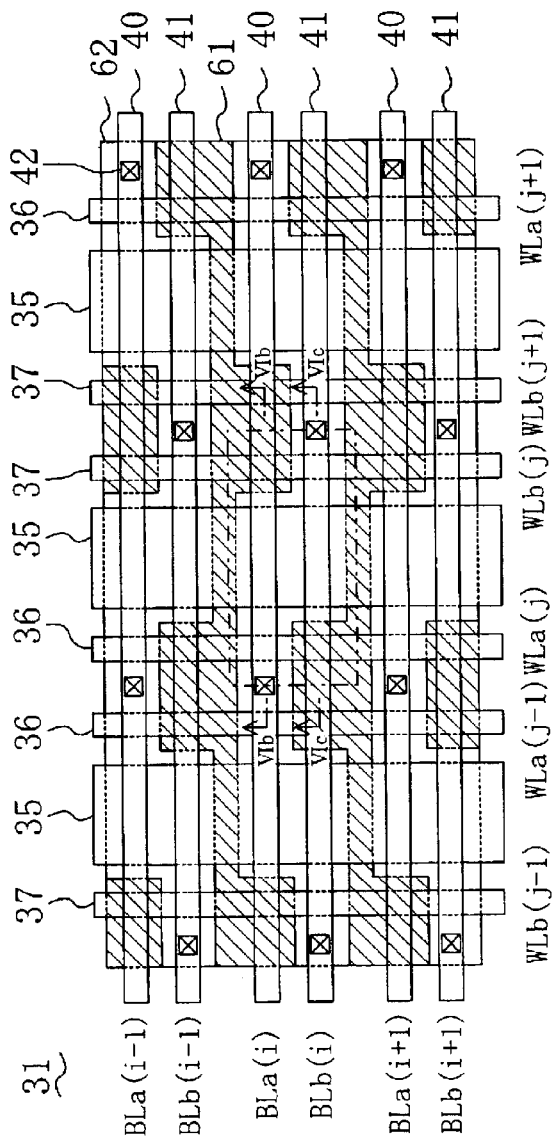
FIG. 6A is a plan view showing a variation of the memory cell array in the semiconductor memory device according to the first embodiment and FIGS. 6B and 6C are structural cross-sectional views taken along the respective lines VIb—VIb and VIc—VIc of FIG. 6A.
Figure 6B:
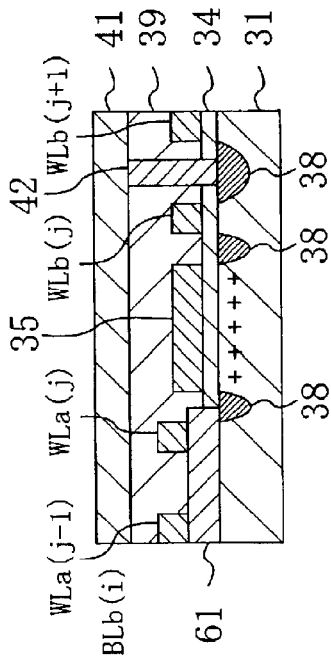
Figure 6C:
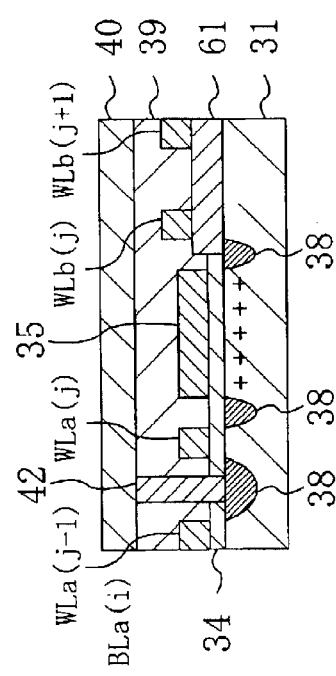

FIGS. 6A to 6C show a variation of the memory cell array 20 in the semiconductor memory device according to the first embodiment, of which 6A shows a plan structure thereof and FIGS. 6B and 6C are structural cross-sectional views taken along the respective lines VIb—VIb and VIc—VIc, respectively. The description of the components shown in FIGS. 6A to 6C which are the same as used in the memory cell array 20 shown in FIGS. 3A to 3C will be omitted by retaining the same reference numerals.

In the memory cell array 20 according to the present variation, a plurality of isolation insulating films 61 composed of, e.g., a silicon oxide are formed not only in the striped regions of the n-type well 31, similarly to the isolation insulating films 32 according to the first embodiment, but also in the region of the n-type well 31 located on one side of the first gate electrode 35 and including the portions underlying the first metal line 40 and the third gate electrode 37 and in the region of the n-type well 31 located on the other side of the gate electrode 35 and including the portions underlying the second metal line 41 and the second gate electrode 36, as shown in FIGS. 6A to 6C. As a result, the active regions 62 show a pattern in which the portions thereof lying under the first metal lines 40 but not lying under the second metal lines 41 and the portions thereof lying under the second metal lines 41 but not lying under the first metal lines 40 repeatedly alternate between the first gate electrodes 35.

In such a structure, each of the second transistors 12 is constituted by the second gate electrode 36 and the impurity diffusion regions 38 on both sides thereof to have a channel width which substantially corresponds to a width of an area including the portion underlying the first metal line 40 and the surrounding active region 62. Likewise, each of the third transistors 13 is constituted by the third gate electrode 37 and the impurity diffusion regions 38 on both sides thereof to have a channel width which substantially corresponds to a width of an area including the portion underlying the second metal line 41 and the surrounding active region 62. This allows a reduction in the area of the channel region, in contrast to the first embodiment, so that a leakage current is suppressed in each of the second and third transistors 12 and 13.

Variation of DRAM Cell

Figure 7:
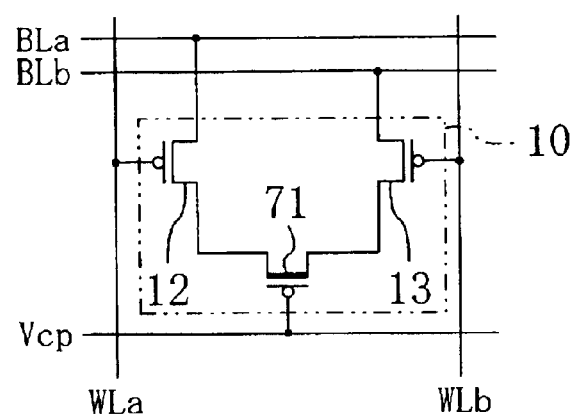
FIG. 7 is a circuit diagram showing a variation of the DRAM cell in the semiconductor memory device according to the first embodiment.

FIG. 7 shows a variation of the DRAM cell 10 in the semiconductor memory device according to the first embodiment. The description of the components shown in FIG. 7 which are the same as used in the first embodiment will be omitted by retaining the same reference numerals.

As shown in FIG. 7, the DRAM cell 10 according to the present variation is constituted such that charges are accumulated in a first transistor 71 composed of a depletion-type p-channel transistor, while the second and third transistors 12 and 13 are the same as in the first embodiment.

Since the first transistor 71 of the DRAM cell 10 according to the present variation is of depletion type, it is in a conductive state even if a gate voltage Vcp is adjusted to about 0 V, which allows the charges to be accumulated in the capacitance between the gate and channel of the first transistor 71. Accordingly, power consumption can be reduced to a level lower than in the semiconductor memory device according to the first embodiment.

It is to be noted that the structure and operation of the memory cell array 20 according to the present variation are the same as in the first embodiment except that the first transistor 11 of the DRAM cell 10 is composed of a depletion-type transistor, which is different from that of the DRAM cell in the semiconductor memory device according to the first embodiment.

The DRAM cell 10 according to the present variation not only achieves the same effect as achieved in the first embodiment but also obviates the necessity to apply a voltage to the gate so that a semiconductor memory device with lower power consumption is implemented.

Embodiment 2

A second embodiment of the present invention will be described with reference to the drawings.

Figure 8A:
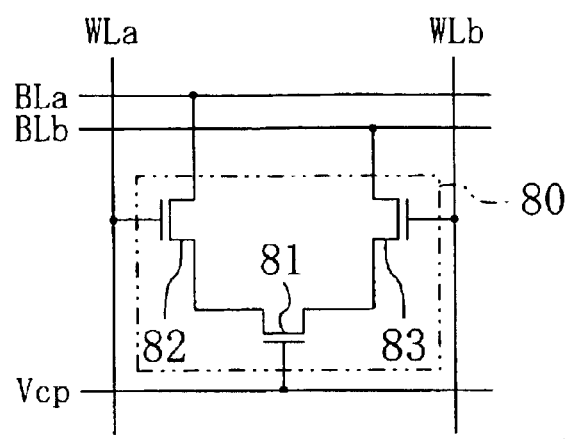
FIG. 8A is a circuit diagram showing a DRAM cell in a semiconductor memory device according to a second embodiment of the present invention and FIG. 8B is a circuit diagram showing a variation of the DRAM cell in the semiconductor memory device according to the second embodiment.

FIG. 8A shows a circuit structure of each of DRAM cells in a semiconductor memory device according to the second embodiment. As shown in FIG. 8A, a DRAM cell 80 according to the second embodiment is composed of: a first transistor 81 composed of an n-channel MIS transistor for accumulating charges; a second transistor 82 composed of an n-channel MIS transistor having a source connected to the source or drain of the first transistor 81; and a third transistor 83 composed of an n-channel MIS transistor having a source connected to the source or drain of the first transistor 81. The second transistor 82 has a gate connected to a first word line WLa and a drain connected to a first bit line BLa. The third transistor 83 has a gate connected to a second word line WLb and a drain connected to a second bit line BLb.

Since the second embodiment has used the n-channel MIS transistors for the individual transistors (the first, second, and third transistors 81, 82, and 83) composing the DRAM cell 80, the second and third transistors 82 and 83 are turned ON if the word lines are brought into high potential states and thereby activated. The channel is brought into a conductive state with the application of a positive voltage to the gate of the first transistor 81.

As a variation of the DRAM cell 80 in the semiconductor memory device according to the second embodiment, the first transistor 80 may also be composed of a depletion type transistor in the same manner as in the variation of the DRAM cell according to the first embodiment. A description will be given herein below to the variation of the DRAM cell 80 in which the first transistor 81 of the DRAM cell 80 is formed as a depletion type.

Figure 8B:
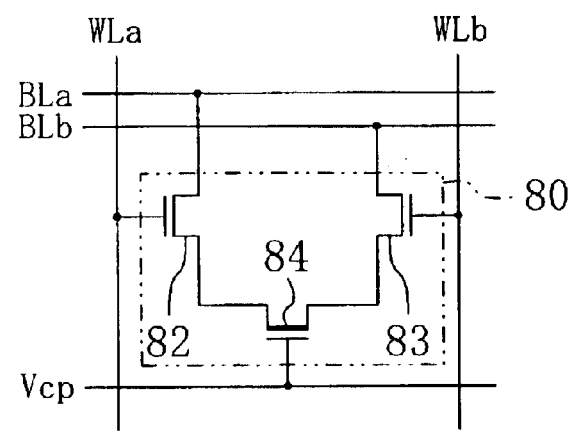

FIG. 8B shows the variation of the DRAM cell in the semiconductor memory device according to the second embodiment. The description of the components shown in FIG. 8B which are the same as shown in FIG. 8A will be omitted by retaining the same reference numerals.

As shown in FIG. 8B, the variation of the DRAM cell 80 according to the second embodiment uses a first transistor 84 composed of an n-channel transistor having a depletion-type channel in place of the first transistor 81 according to the second embodiment.

Since the present variation uses a depletion-type transistor for the first transistor 84, it is possible to bring the channel into a conductive state at 0 V without applying a positive voltage to the gate so that power consumption is reduced to a level lower than in the semiconductor memory device according to the second embodiment.

It is to be noted that the circuit structure of the memory cell array 20 consisting of the DRAM cells 80 arranged in the semiconductor memory device according to the second embodiment can also be implemented in the same manner as in the first embodiment.

Since the second embodiment has used the n-channel transistors to compose the DRAM cell 80, the mobility of electrons in the channel is improved so that a semiconductor memory device with a high operating speed is obtainable.

A description will be given next to a specific structure of the DRAM cell according to the second embodiment.

Figure 9A:
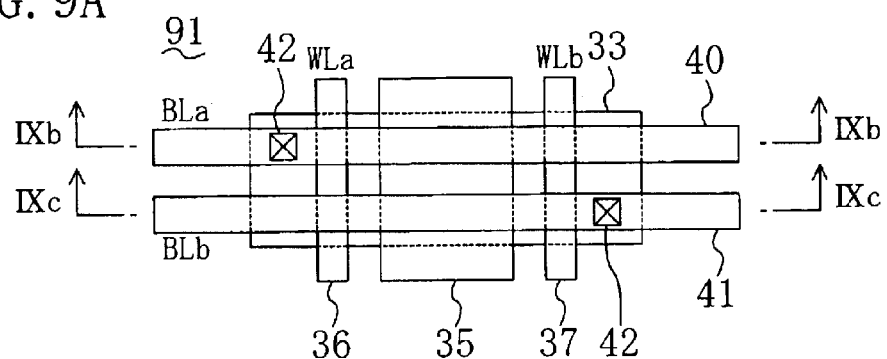
FIG. 9A is a plan view showing the DRAM cell in the semiconductor memory device according to the second embodiment and FIGS. 9B and 9C are structural cross-sectional views taken along the respective lines XIb—XIb and XIc–XIc of FIG. 9A.
Figure 9B:
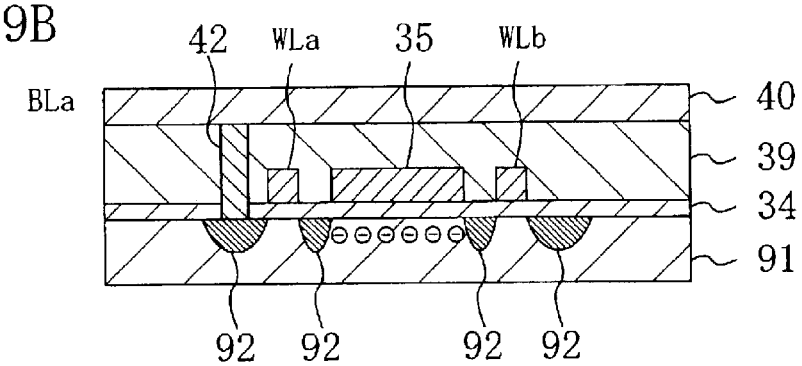
Figure 9C:
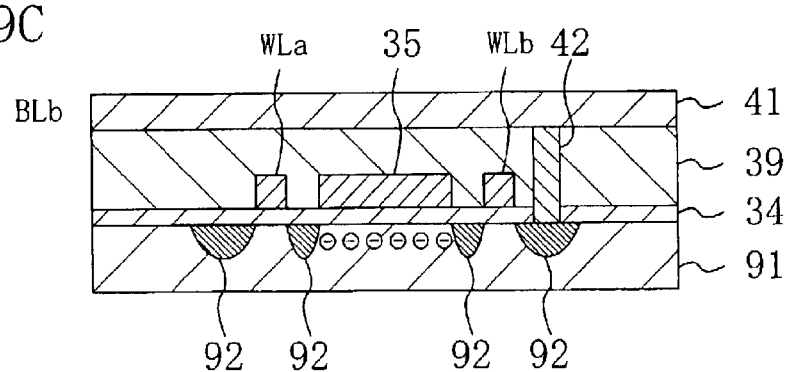

FIGS. 9A to 9C show the specific structure of the DRAM cell 80 in the semiconductor memory device according to the second embodiment, of which FIG. 9A shows a plan structure thereof and FIGS. 9B and 9C show the cross-sectional structures thereof taken along the respective lines IXb—IXb and IXc—IXc of FIG. 9A. The description of the components shown in FIGS. 9A to 9C which are the same as used in the memory cell array according to the first embodiment shown in FIGS. 3A to 3C will be omitted by retaining the same reference numerals.

As shown in FIGS. 9A to 9C, the DRAM cell 80 is formed with the active regions 33 defined in stripes by forming isolation insulating films in a p-type well 91 formed in a semiconductor substrate composed of, e.g., silicon. Impurity diffusion regions 92 each containing an n-type impurity diffused therein are formed in the portions of the p-type well 91 located on both sides of the first, second, and third gate electrodes 35, 36, and 37. The first gate electrode 35 and the impurity diffusion regions 92 on both sides thereof constitute a first transistor 81. Likewise, the second gate electrode 36 and the impurity diffusion regions 92 on both sides thereof constitute a second transistor 82 and the third gate electrode 37 and the impurity diffusion regions 92 on both sides thereof constitute a third transistor 83.

Although only one DRAM cell is shown in each of FIGS. 9A to 9C, a memory cell array according to the second embodiment can be composed of the same memory cell array 20 as shown in FIGS. 3A to 3C.

In the second embodiment, the first transistor 81 is constituted by the first gate electrode 35 and the impurity diffusion regions 92 on both sides thereof. Likewise, the second transistor 82 is constituted by the second gate electrode 36 and the impurity diffusion regions 92 on both sides thereof and the third transistor 83 is constituted by the third gate electrode 37 and the impurity diffusion regions 92 on both sides thereof. Each of the transistors (the first, second, and third transistors 81, 82, and 83) has a channel width corresponding to the width of the active region 33 including the portions underlying the first and second metal lines 40 and 41.

The isolation insulating film may also be formed under the first or second metal line 40 or 41 such that the areas of the channel regions of the second and third transistors 82 and 83 are reduced in the same manner as in the variation of the memory cell array according to the first embodiment shown in FIGS. 6A to 6C.

In the structure of the DRAM cell 80 according to the second embodiment, the second and third transistors 82 and 83 need not necessarily be n-channel transistors. Either one or each of the transistors may be a p-channel transistor. In this case, the specific structure of the memory cell array and a voltage applied to the word lines WLa and WLb should naturally be changed but the same effect concerning a higher data transfer speed as described above is achievable.

Thus, the semiconductor memory device according to the second embodiment not only achieves the same effect as achieved in the first embodiment and the variations thereof but also allows the DRAM cell to be formed from n-channel MIS transistors, which is different from the DRAM cell according to the first embodiment. As a result, a semiconductor memory device with a higher operating speed can be implemented.

Embodiment 3

A third embodiment of the present invention will be described with reference to the drawings.

Figure 10A:
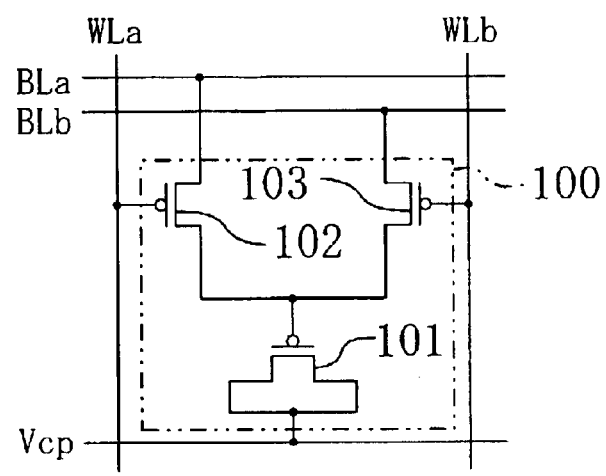
FIG. 10A is a circuit diagram showing a DRAM cell in a semiconductor memory device according to a third embodiment of the present invention and FIG. 10B is a circuit diagram showing a variation of the DRAM cell in the semiconductor memory device according to the third embodiment.

FIG. 10A shows a circuit structure of each of DRAM cells in a semiconductor memory device according to the third embodiment. As shown in FIG. 10A, a DRAM cell 100 according to the third embodiment is composed of: a first transistor 101 composed of a p-channel MIS transistor for accumulating charges; a second transistor 102 composed of a p-channel MIS transistor having a source connected to the gate of the first transistor 101; and a third transistor 103 composed of a p-channel MIS transistor having a source connected to the gate of the first transistor 101. The second transistor 102 has a gate connected to a first word line WLa and a drain connected to a first bit line BLa. The third transistor 103 has a gate connected to a second word line WLb and a drain connected to a second bit line BLb.

In the first transistor 101, the application of a bias voltage Vcp to the source and drain thereof allows the accumulation of charges in the capacitance between the channel and gate and retention of data as the presence or absence of the charges The second and third transistors 102 and 103 allow access to the first transistor 101 from the first and second bit lines BLa and BLb connected to the respective drains of the second and third transistors 102 and 103 by bringing the first and second word lines WLa and WLb connected to the respective gates of the second and third transistors 102 and 103 into low potential states and thereby activating the first and second word lines WLa and WLb.

By arranging the DRAM cells 100 as a matrix composing a memory cell array in the semiconductor memory device according to the third embodiment and alternately selecting the port a using the first word line WLa and the first bit line BLa and the port b using the second word line WLb and the second bit line BLb, the data transfer speed can be increased. It is also possible to improve the reliability of data by using the word line driver 50 shown in FIG. 5A and thereby elongating a write period.

In the semiconductor memory device according to the third embodiment, the DRAM cell 100 may also be composed of n-channel transistors instead of the p-channel transistors. A description will be given herein below to a variation of the DRAM cell 100 composed of n-channel transistors.

Figure 10B:
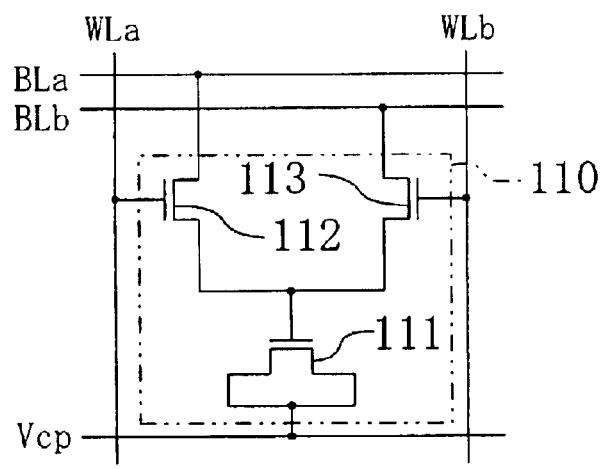
Figure 11:
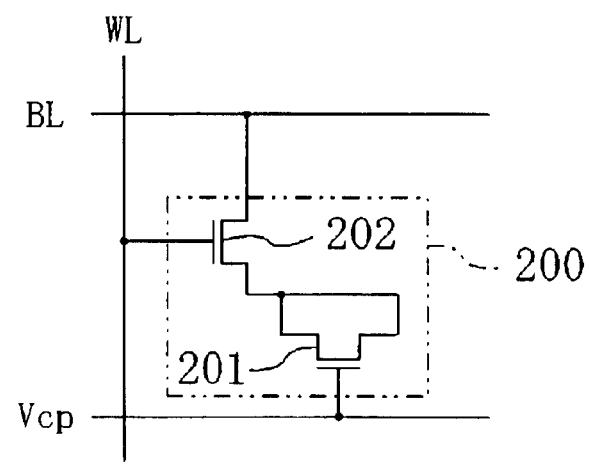
FIG. 11 is a circuit diagram showing a DRAM cell in a conventional semiconductor memory device.

FIG. 10B shows a circuit structure of the variation of the DRAM cell in the semiconductor memory device according to the third embodiment.

As shown in FIG. 10B, the DRAM cell 110 according to the variation of the third embodiment is composed of: a first transistor 111 composed of an n-channel MIS transistor for accumulating charges; a second transistor 112 composed of an n-channel MIS transistor having a source connected to the gate of the first transistor 111; and a third transistor 113 composed of an n-channel MIS transistor having a source connected to the gate of the first transistor 111. The second transistor 112 has a gate connected to the first word line WLa and a drain connected to the first bit line BLa. The third transistor 113 has a gate connected to the second word line WLb and a drain connected to the second bit line BLb.

Thus, the semiconductor memory device according to the third embodiment not only achieves the same effect as achieved in the first embodiment and the variations thereof but also accumulates charges in the gate so that the leakage of the accumulated charges is suppressed. This increases the reliability of data held by the DRAM cells 110.

What is claimed is:

1. A semiconductor memory device comprising:
   a plurality of memory cells each having a first transistor, a second transistor having a source or drain connected to a portion of a source or drain of the first transistor, and a third transistor having a source or drain connected to another portion of the source or drain of the first transistor,
   the first transistor accumulating, in a channel thereof, a charge transferred from the second and third transistors.

2. The semiconductor memory device of claim 1, wherein the first, second, and third transistors are of the same conductivity type.

3. The semiconductor memory device of claim 1, wherein the first, second, and third transistors are p-channel transistors.

4. The semiconductor memory device of claim 1, wherein the first, second, and third transistors are n-channel transistors.

5. The semiconductor memory device of claim 1, wherein a predetermined voltage is applied to a gate of the first transistor such that the first transistor is in a conductive state when a power supply is ON.

6. The semiconductor memory device of claim 1, wherein the first transistor is of depletion type.

7. The semiconductor memory device of claim 1, further comprising:
a plurality of first word lines connected to respective gates of the second transistors of the plurality of memory cells; and
a plurality of second word lines connected to respective gates of the third transistors of the plurality of memory cells, wherein
activation of one of the plurality of first word lines and activation of one of the plurality of second word lines are initiated alternately.

8. The semiconductor memory device of claim 7, wherein one of the plurality of first word lines and one of the plurality of second word lines which are connected to different memory cells have respective activation periods in overlapping relation and one of the plurality of first word lines and one of the plurality of second word lines which are connected to a same memory cell have respective activation periods in non-overlapping relation.

9. The semiconductor memory device of claim 8, wherein one of the first and second word lines connected to the same memory cell which is activated earlier than the other is brought into an inactivated state such that the activation period thereof does not overlap the activation period of the other word line.

10. The semiconductor memory device of claim 7, further comprising:
a plurality of first bit lines connected to the respective sources or drains, which are not connected to the first transistors, of the second transistors; and
a plurality of second bit lines connected to the respective sources or drains, which are not connected to the first transistors, of the third transistors, wherein
the memory cells are arranged with an isolation region interposed therebetween in a direction in which the first and second word lines extend and are arranged in an indiscrete active region with the second and third transistors alternately interposed therebetween in a direction in which the first and second bit lines extend,
each of contacts providing connections between the second transistors and the first bit lines is used commonly by the respective second transistors of the adjacent memory cells which are opposed to each other, and
each of contacts providing connections between the third transistors and the second bit lines is used commonly by the respective third transistors of the adjacent memory cells which are opposed to each other.

11. The semiconductor memory device of claim 10, wherein
each of the second transistors is formed to have a channel crossing widthwise under the corresponding one of the first bit lines and
each of the third transistors is formed to have a channel crossing widthwise under the corresponding one of the second bit lines.

12. The semiconductor memory device of claim 10, wherein respective gate electrodes of the first transistors are disposed between the first and second word lines in parallel relation with the first and second word lines.

13. The semiconductor memory device of claim 10, wherein
each of the first, second, and third transistors is formed to have a channel passing widthwise over the corresponding ones of the first and second bit lines.

14. A semiconductor memory device comprising:
a plurality of memory cells each having a first transistor, a second transistor having a source or drain connected to a gate of the first transistor, and a third transistor having a source or drain connected to the gate of the first transistor,
each of the second and third transistors transferring a charge to the gate of the first transistor.

15. The semiconductor memory device of claim 14, wherein the first, second, and third transistors are of the same conductivity type.

16. The semiconductor memory device of claim 14, wherein the first, second, and third transistors are p-channel transistors.

17. The semiconductor memory device of claim 14, wherein the first, second, and third transistors are n-channel transistors.

* * * * *